(12) United States Patent
Loeser et al.

(10) Patent No.: US 8,604,467 B2
(45) Date of Patent: Dec. 10, 2013

(54) ORGANIC ELECTRO-OPTICAL COMPONENT

(75) Inventors: Falk Loeser, Dresden (DE); Oliver Langguth, Dresden (DE)

(73) Assignee: Novaled AG, Dresden (DE)

( * ) Notice: Subject to any disclaimer, the term of this patent is extended or adjusted under 35 U.S.C. 154(b) by 213 days.

(21) Appl. No.: 13/305,821

(22) Filed: Nov. 29, 2011

(65) Prior Publication Data
US 2012/0138971 A1  Jun. 7, 2012

(30) Foreign Application Priority Data

Dec. 3, 2010 (DE) .......................... 10 2010 061 013

(51) Int. Cl.
*H01L 29/08* (2006.01)

(52) U.S. Cl.
USPC .............. 257/40; 257/88; 257/101; 257/102; 257/103; 257/E51.018; 438/690

(58) Field of Classification Search
USPC ....... 257/40, 88, 102–103, E51.108; 438/690
See application file for complete search history.

(56) References Cited

U.S. PATENT DOCUMENTS

| | | | |
|---|---|---|---|
| 6,559,375 B1 | 5/2003 | Meissner et al. | |
| 6,639,359 B1 | 10/2003 | Chae | |
| 7,830,089 B2 | 11/2010 | Murano et al. | |
| 2003/0170491 A1 | 9/2003 | Liao et al. | |
| 2003/0189401 A1 | 10/2003 | Kido et al. | |
| 2004/0090187 A1 | 5/2004 | Wu et al. | |
| 2004/0185297 A1 | 9/2004 | Klubek et al. | |
| 2008/0143250 A1 | 6/2008 | Blochwitz-Nimoth et al. | |
| 2009/0009072 A1 | 1/2009 | Wellmann et al. | |
| 2011/0204343 A1 | 8/2011 | Birnstock et al. | |

FOREIGN PATENT DOCUMENTS

| | | |
|---|---|---|
| EP | 1 286 397 A2 | 2/2003 |
| EP | 1 484 632 A1 | 12/2004 |
| EP | 2 227 069 A1 | 9/2010 |
| GB | 2 331 359 A | 5/1999 |

OTHER PUBLICATIONS

German Office Action for German Application No. 10 2010 061 013.5 mailed Nov. 21, 2011.
Brabec et al., 2001, "Plastic Solar Cells," Adv. Funct. Mater., 2001, vol. 11(1):15-26.
Kim et al, 2007, "Efficient Tandem Polymer Solar Cells Fabricated by All-Solution Processing," Science, (13):222-225.
O'Regan et al., 1991, "A low-cost, high-efficiency solar cell based on dye-sensitized colloidal TiO2 films," Nature 353, 737-740.
Tang, 1986, "Two-Layer Organic Photovoltaic Cell," 1986, Appl. Phys. Lett., 48(2):183-185.

*Primary Examiner* — Eugene Lee
*Assistant Examiner* — Elias M Ullah
(74) *Attorney, Agent, or Firm* — Sutherland Asbill & Brennan LLP

(57) ABSTRACT

An organic electro-optical component, with an electrode, counter-electrode, and organic region made up of one or more organic materials, which is in electrical contact and in an active region overlapping with the electrode and the counter-electrode, wherein the electrode and/or the counter-electrode have part electrodes which extend from a part electrode connecting section which is arranged outside of the active region, a distal electrode section is electrically connected via a proximal electrode section to the part electrode connecting section, the distal electrode section is formed at least in sections within the active region, and the proximal electrode section is formed outside of the active region and by means of an electrical pathway, the pathway length of which is larger than the shortest distance between an end of the distal electrode section facing the part electrode connecting section and the part electrode connecting section.

10 Claims, 4 Drawing Sheets

ORGANIC ELECTRO-OPTICAL COMPONENT

CROSS-REFERENCE TO RELATED APPLICATIONS

This application hereby claims priority to German Patent Application No. 10 2010 061 013.5, filed 3 Dec. 2010, the disclosure of which is expressly incorporated herein by reference.

FIELD OF THE INVENTION

The invention relates to new technologies in the field of organic electro-optical components.

BACKGROUND OF THE INVENTION

In the following, three key points will be explained, which constitute central technical problems in the development and successful economic exploitation.

A solar cell converts the energy of light into electrical energy. In contrast to inorganic solar cells, free charge carriers are not created directly by the light in the case of organic solar cells, but instead bound Frenkel excitons first form, which are electrically neutral excitation states in the form of bound electron-hole pairs. These excitons can only be separated by very powerful electric fields or at suitable interfaces. Sufficiently powerful fields are not available in organic solar cells, so that all the promising concepts for organic solar cells are based on the separation of excitons at photoactive interfaces (Organic Donor-Acceptor Interface—C. W. Tang, Applied Physics Letters, 48 (2), 183-185 (1986)) or Inorganic Semiconductor Interface (cf. B. O'Regan et al., Nature 353, 737 (1991)). For this, it is necessary for excitons generated in the bulk of the organic material to be able to diffuse to this photoactive interface.

The low-recombination diffusion of excitons to the active interface therefore plays a critical role in the case of organic solar cells. In order to make a contribution to photo-electric current, the exciton diffusion length in a good organic solar cell must therefore be at least in the same range as the typical penetration depth of light so that the greater part of the light can be exploited. Organic crystals or thin films which are perfect in terms of their structure and chemical purity certainly satisfy this criterion. For large-scale applications, however, it is not possible to use monocrystalline organic materials, and the production of multiple layers with sufficient structural perfection is still very difficult, even today.

Instead of increasing the exciton diffusion length, it is also possible to reduce the mean distance from the closest interface. Document WO 00/33396 proposes the creation of an interpenetrating network: a layer contains a colloidally dissolved substance, which is distributed in such a way that a network forms via which the charge carriers can flow (percolation mechanism). In a network of this kind, the task of light absorption is performed either by only one of the components or by both.

The advantage of a mixed layer of this kind is that the excitons produced only have to travel a very short distance before they reach a domain boundary, where they are separated. The electrons and holes are transported away separately in the dissolved substance or in the rest of the layer. Since the materials in the mixed layer are in contact with one another everywhere, it is decisive with this concept that the separated charges should have a long life on the material concerned and that closed percolation paths are available from every location for both charge carrier locations to the respective contact. With this approach, it was possible to achieve efficiencies of 2.5% for polymer-based solar cells produced by wet-chemical means (C. J. Brabec et al., Advanced Functional Material 11, 15 (2001)), while polymer-based tandem cells already have an efficiency of more than 6% (J. Y. Kim et al., Science 13, 222-225 (2007)). Other known approaches for achieving or improving the properties of organic solar cells are listed below:

SUMMARY OF THE INVENTION

It is the object of the invention to create an organic electro-optical component, in which the possibility of failure in the event of an electrical short circuit occurring is reduced.

This object is achieved according to the invention by means of an organic electro-optical component with an electrode, a counter electrode and an organic region made up of one or a plurality of organic materials, which is formed in electrical contact and in an active region overlapping with the electrode and the counter electrode, wherein the electrode and/or the counter electrode have part electrodes which extend from a part electrode connecting section which is arranged outside of the active region; a distal electrode section is electrically connected via a proximal electrode section to the part electrode connecting section in at least a portion of the part electrodes in each case; the distal electrode section is formed at least in sections within the active region; and the proximal electrode section is formed outside of the active region and by means of an electrical pathway, the pathway length of which is larger than the shortest distance between an end of the distal electrode section facing the part electrode connecting section and the part electrode connecting section.

BRIEF DESCRIPTION OF THE FIGURES

The invention is explained in more detail in the following on the basis of preferred exemplary embodiments with reference to figures of a drawing. In the figures.

DETAILED DESCRIPTION OF THE INVENTION

Figure 1:
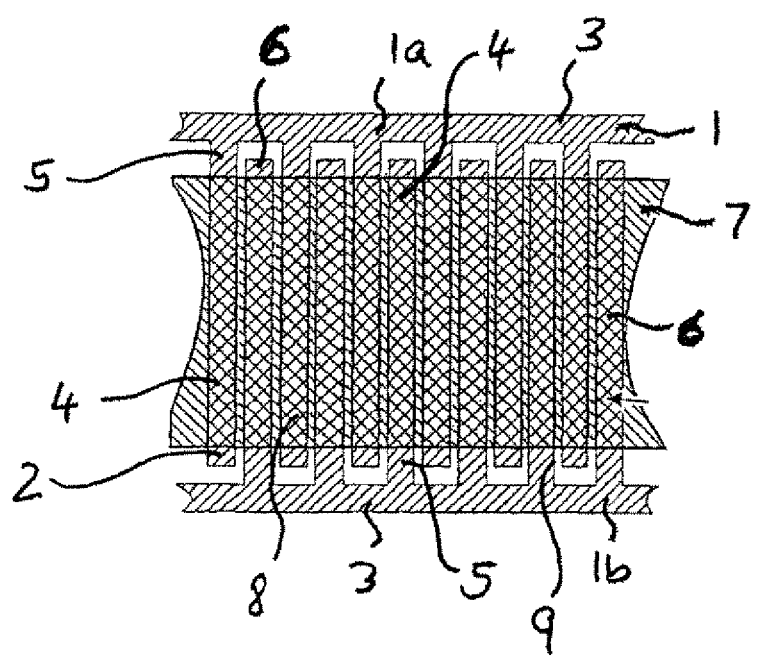
FIG. 1 shows a schematic illustration of a section of an organic electro-optical component with an electrode and an assigned organic region.

The invention comprises the idea of an organic electro-optical component, particularly an organic light-emitting component, with an electrode, a counter electrode and an organic region made up of one or a plurality of organic materials, which is formed in electrical contact and in an active region overlapping with the electrode and the counter electrode, wherein the electrode and/or the counter electrode have part electrodes which extend from a part electrode connecting section which is arranged outside of the active region, a distal electrode section is electrically connected via a proximal electrode section to the part electrode connecting section in at least a portion of the part electrodes in each case, the distal electrode section is formed at least in sections within the active region, and the proximal electrode section is formed outside of the active region and by means of an electrical pathway, the pathway length of which is larger than the shortest distance between an end of the distal electrode section facing the part electrode connecting section and the part electrode connecting section.

With the aid of the suggested design of the electrical pathway in the proximal (part) electrode section, by means of which the part electrodes couple to the part electrode connecting section in each case, an electrical resistance is created which is larger than the electrical resistance which would occur in the event of a direct (straight) connection between the end of the distal electrode section and the part electrode connecting section. In this respect, the electrical pathway in the proximal electrode section is a pathway increasing the electrical resistance. This is achieved in that the effective length of the pathway is enlarged compared to the shortest distance between the end of the distal electrode section and the part electrode connecting section.

The proximal electrode section is formed outside of the active region, that is to say in an inactive region of the component, in which light emission does not take place in the case of the embodiment as organic light-emitting component.

Preferably, the active region, which then optionally extends over a group of part electrodes, is of uniform composition with regard to the organic materials such that light of the same colour is emitted by this active region between electrode and counter electrode. The light can be white light which is formed in the active region by mixing different colours and leaves the active region which is assigned to the group of part electrodes as white light. This embodiment therefore differs from display arrangements where pixels are formed with light emission of different colours by means of the respective part electrode. In contrast to this, a preferred configuration of the invention therefore provides lighting equipment in which an light-emitting area is formed, which is not structured in a pixel-like manner. Preferably, the stack of organic layers is formed to emit white light. In a development, the active region is formed with an area of at least 25 cm2, more preferably with an area of at least 100 cm2. Thus, a large-area component is provided.

In an expedient configuration of the invention, it may be provided that in the proximal electrode section, the electrical pathway extends over a width which is smaller than or equal to the electrode width of the distal electrode section at its end facing the part electrode connecting section. The width of the pathway can be constant or variable, the maximum width not exceeding the electrode width of the distal electrode section at its end facing the part electrode connecting section in this configuration.

An advantageous embodiment of the invention provides that in the proximal electrode section, the electrical pathway extends over a width which is larger than the electrode width of the distal electrode section at its end facing the part electrode connecting section. The width of the pathway can be constant or variable, the maximum width exceeding the electrode width of the distal electrode section at its end facing the part electrode connecting section in this configuration. In one configuration, the pathway can also comprise one or a plurality of sections, the local width of which is smaller than or equal to the electrode width of the distal electrode section at its end facing the part electrode connecting section.

Most preferably, a development of the invention provides that in the proximal electrode section, the electrical pathway extends at least on one side as far as into a neighbouring region to the side of the end of the distal electrode section facing the part electrode connecting section. The electrical pathway and thus the proximal electrode section here extend beyond a lateral edge of the distal electrode section. Here, it can be provided that the overall width of the proximal electrode section is even smaller than the width of the distal electrode section at its end facing the part electrode connecting section. If the part electrode which comprises the electrical pathway belongs to the electrode (thus not to the counter electrode), then the neighbouring part electrode is a part electrode which is formed at the counter electrode for example. For example, a configuration of this type results if part electrodes of the electrode and the counter electrode engage into one another. Electrode sections of one and the same electrode, that is to say electrode sections of the electrode or electrode sections of the counter electrode, can also engage into one another. Configurations of this type can be produced with the aid of two comb electrodes.

In an advantageous configuration of the invention, it may be provided that in the proximal electrode section, the electrical pathway extends at least on one side as far as into a region between a neighbouring part electrode and the part electrode connecting section.

A development of the invention can provide that the electrical pathway is formed with a meandering course.

An advantageous configuration of the invention provides that the electrical pathway is formed with adjustment path sections. With the aid of the adjustment path sections, pathway sections are provided, which can be interrupted or closed subsequently, in order to separate an existing electrical connection or to form a new electrical connection. In this manner, an adjustability of the electrical resistance of the electrical pathway in the proximal electrode section results. Thus, for example in the case of the production of the component, it can be provided to initially produce a semi-finished product which has an electrical pathway with adjustment sections in the region of the proximal electrode section, which can then be processed depending on the component which is ultimately to be produced, in order to form a desired electrical resistance in the region of the proximal electrode section. It can also be provided to supply an arrangement with a substrate and electrode/counter electrode formed thereon in the form of a semi-finished product, in which the part electrodes have an adjustable electrical pathway in their proximal electrode section. In this manner, arrangements of this type can subsequently be used for various designs of organic electro-optical components, for example in order to realise their construction as light-emitting or light-absorbing organic component.

A preferred development of the invention provides that the largest part of pathway sections of the electrical pathway runs parallel to the longitudinal extent of the part electrode connecting section. In this or alternative configurations, it can be provided that the conducting sections of the electrical pathway run for the most part, that is to say more than 50%, essentially parallel to one another. A parallel course of this type can extend for the most part along the part electrode connecting section or essentially perpendicularly thereto.

In an expedient configuration of the invention, it may be provided that the electrode and/or the counter electrode are realised as a comb electrode, in which the part electrodes protrude from the part electrode connecting section as tine electrodes. Various designs for tine electrodes are known per se. These include strip electrodes for example, in the case of which the part electrodes in one configuration are formed as strips with essentially constant strip width, at least in the region of the distal electrode section of the part electrode.

A preferred development of the invention can provide that the organic region is formed with a stack of a plurality of light-emitting units, in which neighbouring units are connected via a connecting unit. Components of this type in a stacked design are known per se in various configurations. Reference is made by way of example to the following documents: US 2009/0009072, U.S. Pat. No. 7,830,089, US 2003/170491, US 2003/189401 and also US 2004/185297.

The stacked light-emitting units can for example be connected with the aid of a connecting unit which has a pn-junction. However, an individual intermediate layer can also form the connecting unit.

Both the electrode and the counter electrode have a layer conductivity which in this respect forms a measurable characteristic variable for the respective electrode. A preferred embodiment provides that the sheet resistance, which is normally specified in Ohm/sq, of the organic region, i.e. for the layers present there as a whole, is at least ten times greater than the sheet resistance of the electrode and/or the counter electrode. If the electrode and the counter electrode have different sheet resistances, then the sheet resistance for the organic region as a whole is preferably at least ten times greater than the sheet resistance of the electrode with the greatest sheet resistance.

FIG. 1 shows a schematic illustration of an arrangement for an organic electro-optical component with an electrode 1 which is formed with two comb electrodes 1a, 1b.

The comb electrode 1a has part electrodes 2 and a part electrode connecting section 3 electrically connecting the part electrodes 2. The further comb electrode 1b is constructed in this manner in the exemplary embodiment illustrated. The part electrodes 2 have a distal electrode section 4 which is arranged remotely from the part electrode connecting section 3. Between the distal electrode section 4 and the part electrode connecting section 3, a proximal electrode section 5 of the part electrode 2 is arranged, which electrically connects the distal electrode section 4 to the part electrode connecting section 3.

The part electrodes 2 of the comb electrode 1a and part electrodes 6 of the further comb electrode 1b are overlaid to some extent by an organic region 7 which consists of one or a plurality of organic materials, so that in the organic region 7 light can be emitted when an electric voltage is applied or light can be absorbed for obtaining electrical energy. The overlapping region between the part electrodes 2, 6 on the one hand and the organic region 7 on the other hand in this respect forms an active region 8 of the component. Organic region 7 and active region 8 can overlap completely. Outside of the active region 8, an inactive region 9 is formed, which is characterised in FIG. 2 by means of shading.

Figure 2:
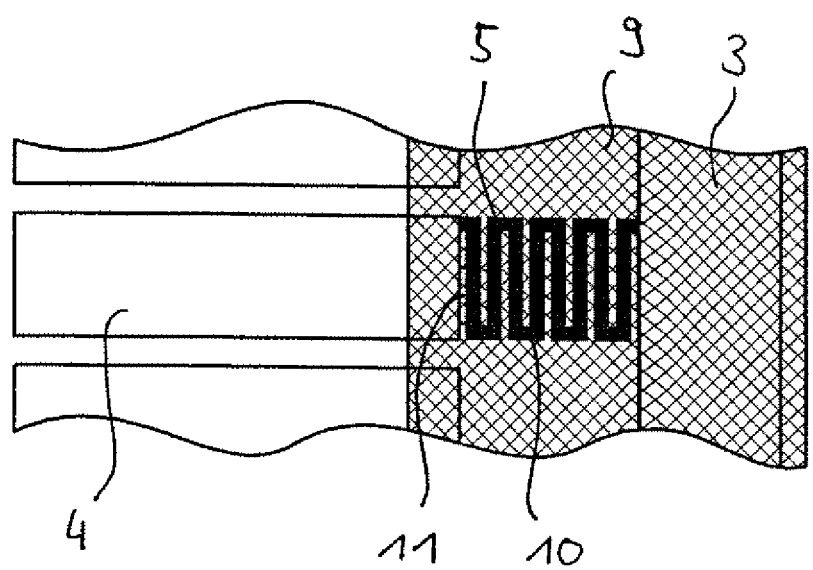
FIG. 2 shows a schematic illustration of a section from the arrangement in FIG. 1 in detail.
Figure 3:
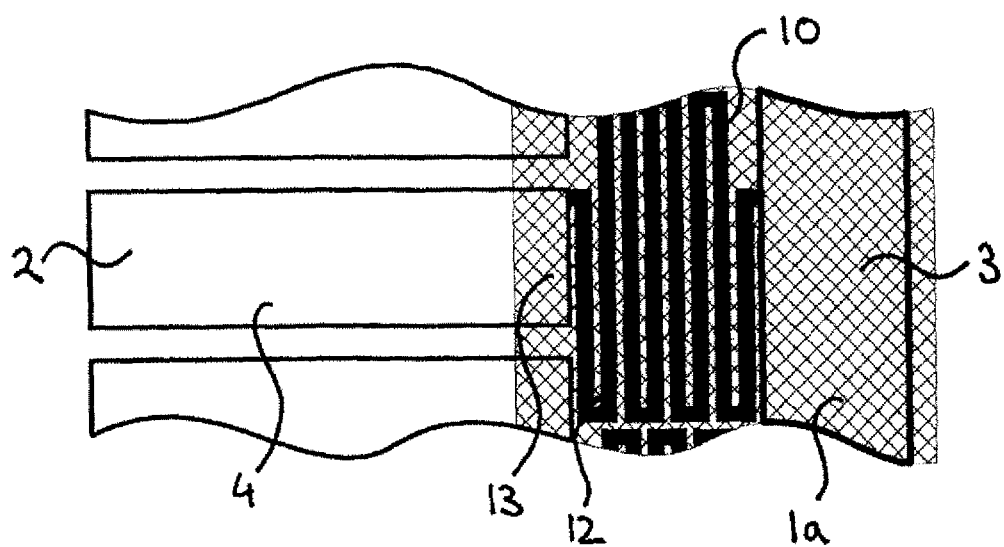
FIG. 3 shows a schematic illustration of a section from the arrangement in FIG. 1 in another embodiment.

FIGS. 2 and 3 show a section of the arrangement from FIG. 1 for various embodiments in detail. In FIGS. 2 and 3, for the same features, the same reference numbers are used as in FIG. 1. The result is that the proximal electrode section 5 is arranged in each case outside of the active region 8, namely in the inactive region 9, as also applies for the part electrode connecting section 3. By contrast, the distal electrode section 4 is formed at least partly in the active region 8.

The proximal electrode section 5 is in each case produced with an electrical pathway 10 which has a meandering course in the embodiment illustrated. In the embodiment in FIG. 2, the width of the proximal electrode section 5 with the pathway 10 is limited to the width at one end 11 of the part electrode 2 which faces the part electrode connecting section 3. By contrast, the electrical pathway 10 extends in the embodiment according to FIG. 3 over a larger width, i.e. beyond the lateral edge of the part electrode 2.

In both embodiments in FIGS. 2 and 3, the sections of the electrical pathway 10 run to a large extent parallel to one another and parallel to the longitudinal extent of the part electrode connecting section 3. Common to the configurations is the fact that the pathway length of the electrical pathway 10 is substantially larger than the vertical distance between the end 11 and the part electrode connecting section 3. This distance is illustrated in FIG. 2 by means of a double arrow A.

Figure 4:
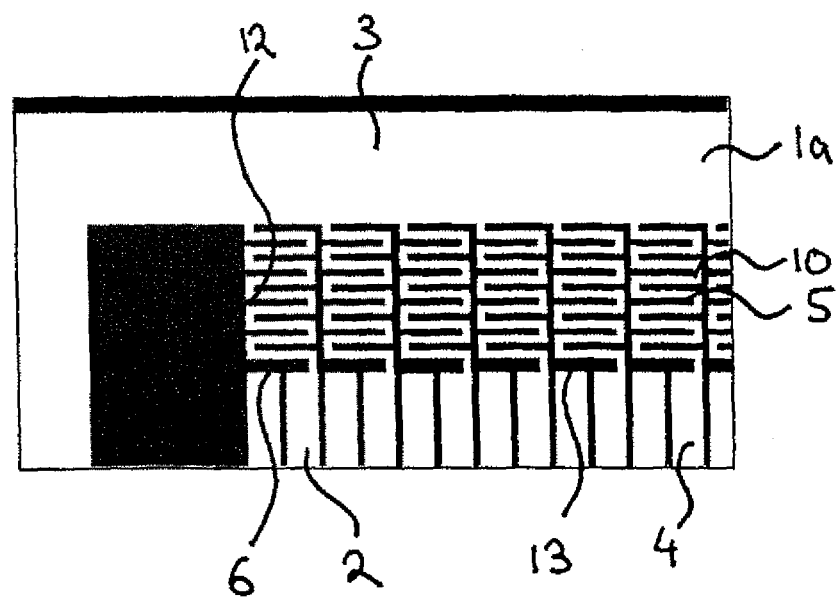
FIG. 4 shows a schematic illustration with mutually engaging part electrodes and FIG. 5 shows a schematic illustration with an electrical pathway with adjustment path sections.

FIG. 4 shows a schematic illustration of an arrangement with a plurality of part electrodes 2 of the comb electrode 1a, which are connected via an electrical pathway 10, which is constructed in a meandering manner, to the assigned part electrode connecting section 3, and also part electrodes 6 which emanate from the further comb electrode 1b. The electrical pathways 10 in this case also encompass a region 12 between one end 13 of the part electrodes 2 of the further comb electrode 1b, which faces the part electrode connecting section 3, and the part electrode connecting section 3.

Figure 5:
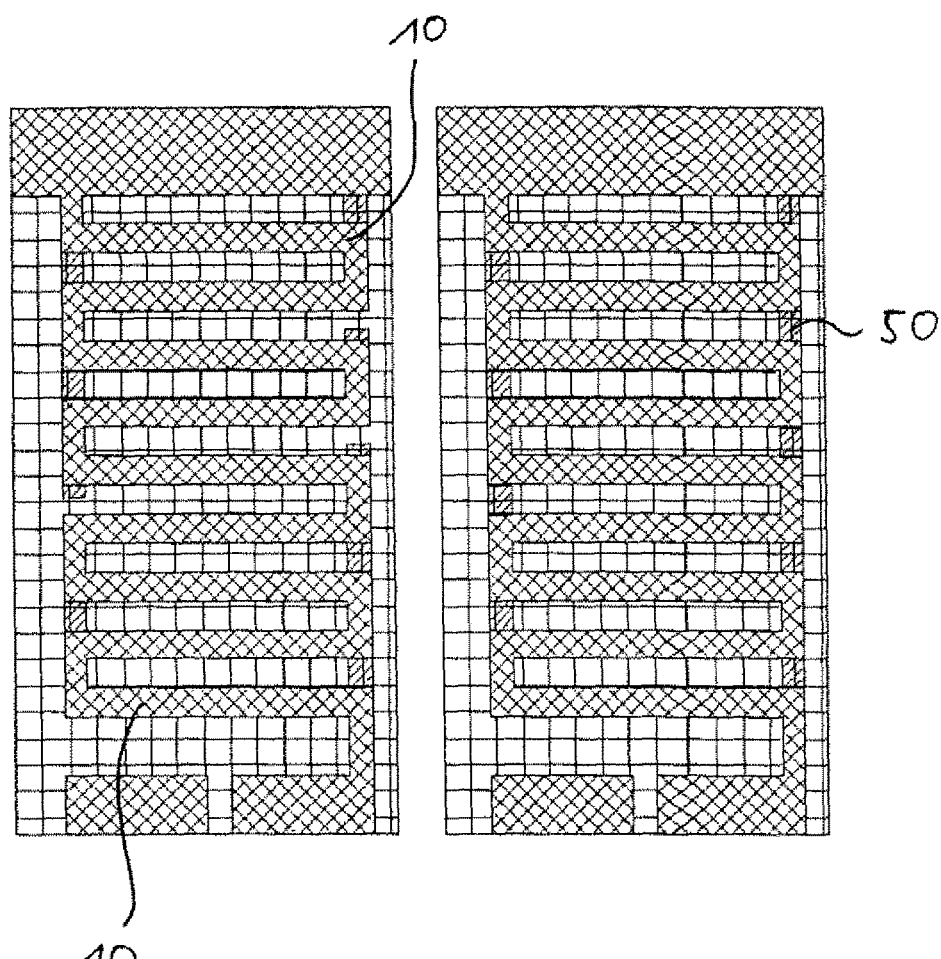

FIG. 5 shows a schematic illustration of an arrangement in which the electrical pathway 10 has adjustment sections 50 (cf. illustration on the right side) which can be processed for setting a desired pathway length and in this regard for setting a desired electrical resistance. The adjustment sections 50 are illustrated shaded to highlight them. They are part of the same layer in a preferred configuration. The left illustration in FIG. 5 shows the electrical pathway 10 following the processing of the adjustment sections 50.

Furthermore, a configuration for the organic electro-optical component is produced in the form of an organic light-emitting diode (OLED). An OLED with layers 1.1. to 1.16 was produced on an ITO electrode:

1.1 50 nm 2,2',7,7'-tetrakis-(N,N-dimethylphenylamino)-9,9'-spirobifluorene doped with 4 mol % 2-(6-dicyanomethylene-1,3,4,5,7,8-hexafluoro-6H-naphthalene-2-ylidene)-malononitrile as p-doped hole transport layer;

1.2 10 nm NPB as intermediate layer, 1.3 20 nm spiro-DPVBI;

1.4 10 nm 2,4,7,9-tetraphenyl-1,10-phenanthroline;

1.5 45 nm 2,4,7,9-tetraphenyl-1,10-phenanthroline doped with 5 mol % tetrakis(1,3,4,6,7,8-hexahydro-2H-pyrimido[1,2-a]pyrimidinato)ditungsten (II) as n-doped electron transport layer;

1.6 50 nm 2,2',7,7'-tetrakis-(N,N-dimethylphenylamino)-9,9'-spirobifluorene doped with 4 mol % 2-(6-dicyanomethylene-1,3,4,5,7,8-hexafluoro-6H-naphthalene-2-ylidene)-malononitrile as p-doped hole transport layer;

1.7 10 nm NPB as intermediate layer, 1.8 20 nm spiro-DPVBI;

1.9 10 nm 2,4,7,9-tetraphenyl-1,10-phenanthroline;

1.10 45 nm 2,4,7,9-tetraphenyl-1,10-phenanthroline doped with 5 mol % tetrakis(1,3,4,6,7,8-hexahydro-2H-pyrimido[1,2-a]pyrimidinato)ditungsten (II) as n-doped electron transport layer;

1.11 50 nm 2,2',7,7'-tetrakis-(N,N-dimethylphenylamino)-9,9'-spirobifluorene doped with 4 mol % 2-(6-dicyanomethylene-1,3,4,5,7,8-hexafluoro-6H-naphthalene-2-ylidene)-malononitrile as p-doped hole transport layer;

1.12 10 nm NPB as intermediate layer, 1.13 20 nm spiro-DPVBI;

1.14 10 nm 2,4,7,9-tetraphenyl-1,10-phenanthroline;

1.15 20 nm 2,4,7,9-tetraphenyl-1,10-phenanthroline doped with 5 mol % tetrakis(1,3,4,6,7,8-hexahydro-2H-pyrimido[1,2-a]pyrimidinato)ditungsten (H) as n-doped electron transport layer;

1.16 100 nm aluminium as reflecting cathode.

This is an OLED emitting blue light with three stacked light-emitting units, neighbouring units being connected via an intermediate layer. The OLED generates 1000 cd/m2 at approximately 13.5 V.

For comparison, a further OLED with the same layer stack was produced, which did not have the above-described electrode structure however, bur rather a conventional electrode structure, as is known from the prior art, i.e. without proximal electrode sections which are designated above with the reference number 5. Whilst the OLED with the electrode structure according to the invention were still functional after 100 hours, the OLED produced for comparison failed completely after just 30 hours.

The features of the invention disclosed in the previous description, the claims and the drawing can be of importance both individually and in any desired combination for realising the invention in its various embodiments.

The invention claimed is:

1. An organic electro-optical component comprising an electrode, a counter electrode, an active region, and an organic region comprising one or a plurality of organic materials, wherein the organic region is in electrical contact with the electrode and the counter electrode, and the organic region is arranged at least partly in the active region, which comprises the areas in which the electrode and counter electrode overlap, wherein the electrode or the counter electrode comprises one or more part electrodes which extend from a part electrode connecting section arranged outside of the active region, the one or more part electrodes comprise one or more distal electrode sections that are electrically connected via one or more proximal electrode sections to the part electrode connecting section, at least part of the one or more distal electrode sections is arranged within the active region, and the one or more proximal electrode sections are arranged outside of the active region, and comprise an electrical pathway, wherein the length of the electrical pathway is larger than the shortest distance between an end of the distal electrode section adjacent to the one or more proximal electrode sections the part electrode connecting section.

2. The component according to claim 1, wherein, the electrical pathway extends over a width which is smaller than or equal to the electrode width of the distal electrode section at its end facing the part electrode connecting section.

3. The component according to claim 1, wherein, the electrical pathway extends over a width which is greater than the electrode width of the distal electrode section at its end facing the part electrode connecting section.

4. The component according to claim 1, wherein, the electrical pathway extends at least on one side as far as into a neighbouring region to the side of the end of the distal electrode section facing the part electrode connecting section.

5. The component according to claim 4, wherein, the electrical pathway extends at least on one side as far as into a region between a neighbouring part electrode and the part electrode connecting section.

6. The component according to claim 1, wherein the electrical pathway comprises a meandering course.

7. The component according to claim 1, wherein the electrical pathway comprises adjustment path sections.

8. The component according to claim 1, wherein the largest part of pathway sections of the electrical pathway runs parallel to the longitudinal extent of the part electrode connecting section.

9. The component according to claim 1, wherein the electrode or the counter electrode comprises a comb electrode, wherein the part electrodes protrude from the part electrode connecting section as tines.

10. The component according to claim 1, wherein the organic region comprises a stack of a plurality of light-emitting units, wherein neighbouring units are connected via a connecting unit.

* * * * *

UNITED STATES PATENT AND TRADEMARK OFFICE
CERTIFICATE OF CORRECTION

PATENT NO. : 8,604,467 B2
APPLICATION NO. : 13/305821
DATED : December 10, 2013
INVENTOR(S) : Falk Loeser et al.

It is certified that error appears in the above-identified patent and that said Letters Patent is hereby corrected as shown below:

In the Claims:

At column 8, line 3, after "sections" insert --and--.

Signed and Sealed this
Twenty-fifth Day of March, 2014

Michelle K. Lee
*Deputy Director of the United States Patent and Trademark Office*